United States Patent [19]
Lecinski et al.

[11] Patent Number: 5,997,266
[45] Date of Patent: Dec. 7, 1999

[54] APPARATUS FOR HOUSING FANS

[75] Inventors: Daniel J. Lecinski, Arlington Heights; Amir Koradia, Palatine; Frank McQuade, Schaumburg; Dane Greives, Buffalo Grove; Kenneth S. Laughlin, Arlington Heights, all of Ill.

[73] Assignee: 3Com Corp., Rolling Meadows, Ill.

[21] Appl. No.: 09/320,074

[22] Filed: May 26, 1999

[51] Int. Cl.$^6$ .............................. F04B 17/00; H05K 7/20
[52] U.S. Cl. ...................................... 417/423.14; 361/695
[58] Field of Search .................. 417/423.14, 423.15, 417/423.5, 360; 361/695, 687, 688; 415/119

[56] References Cited

U.S. PATENT DOCUMENTS

| | | | |
|---|---|---|---|
| 4,751,872 | 6/1988 | Lawson, Jr. .............................. | 454/184 |
| 4,767,262 | 8/1988 | Simon ..................................... | 415/119 |
| 4,912,857 | 4/1990 | Parent et al. ............................. | 34/611 |
| 5,110,263 | 5/1992 | Chiu ..................................... | 416/244 R |
| 5,142,442 | 8/1992 | Daniels et al. .......................... | 361/687 |
| 5,190,496 | 3/1993 | Shih-Chin ............................... | 454/210 |
| 5,287,009 | 2/1994 | Heung ..................................... | 307/141 |
| 5,287,244 | 2/1994 | Hileman et al. ......................... | 361/687 |
| 5,412,534 | 5/1995 | Cutts et al. .............................. | 361/695 |
| 5,528,454 | 6/1996 | Niklos ..................................... | 361/695 |
| 5,562,410 | 10/1996 | Sachs et al. ........................... | 415/213.1 |
| 5,787,971 | 8/1998 | Dodson ................................... | 165/121 |
| 5,788,467 | 8/1998 | Zenitani et al. ......................... | 417/360 |
| 5,788,566 | 8/1998 | McAnally et al. ....................... | 454/184 |
| 5,800,258 | 9/1998 | Knoop et al. ............................ | 454/184 |
| 5,899,313 | 5/1999 | Pratt ....................................... | 194/206 |

Primary Examiner—Charles G. Freay
Assistant Examiner—Robert Z. Evora
Attorney, Agent, or Firm—Baniak Nicholas Pine & Gannon

[57] ABSTRACT

An apparatus for housing fans includes a mounting body portion and first, second and third fan housings. The mounting body portion has a length, and includes first and second longitudinal sides. The fan housings are operably attached to the mounting body portion. The fan housings also have a length. The sum of the lengths of the fan housings are greater than the length of the mounting body portion. The fan housings include a cable trough. Each of the cable troughs are oriented adjacent to a region of the mounting body portion bounded by each of the fan housings.

20 Claims, 3 Drawing Sheets

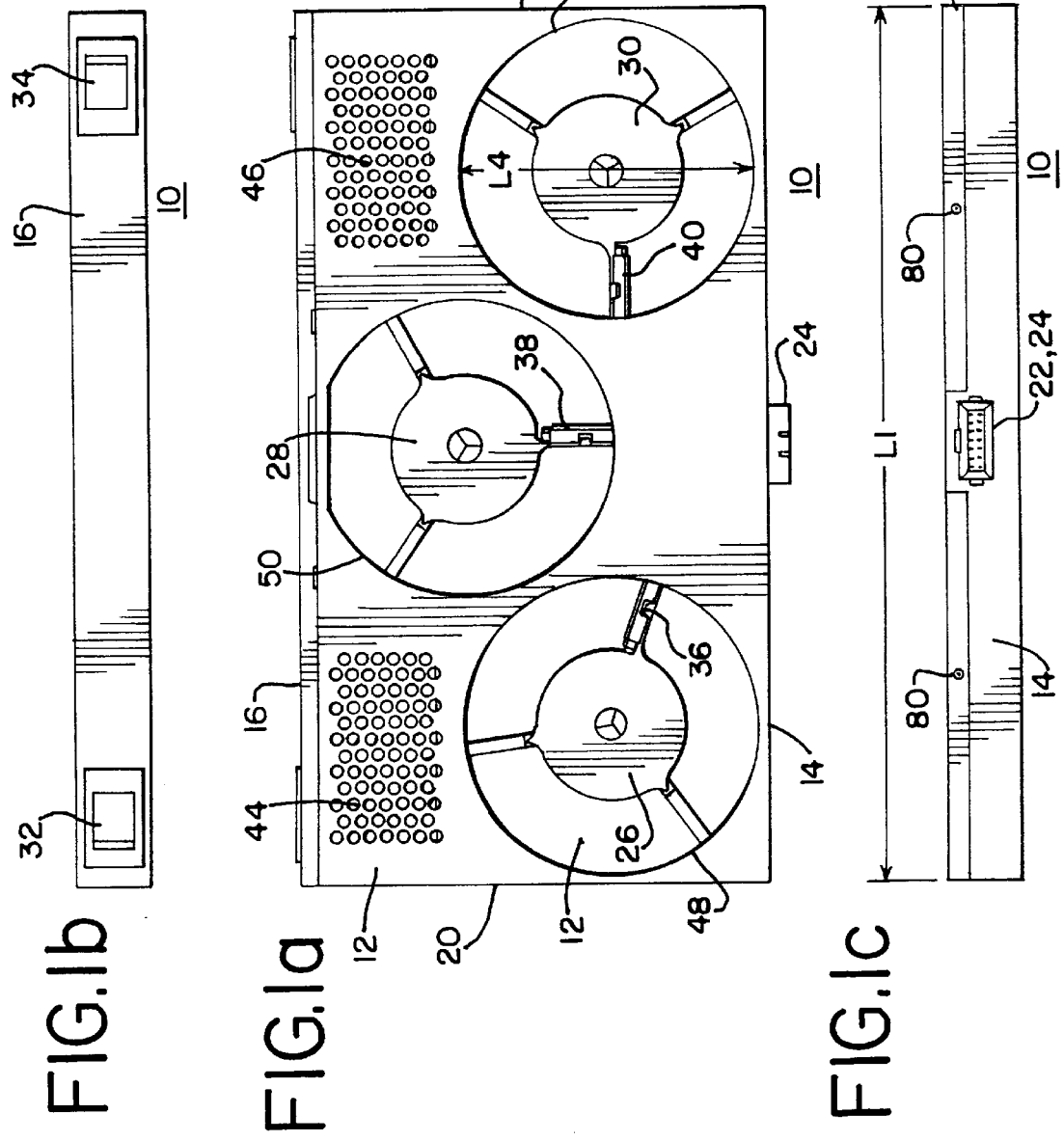

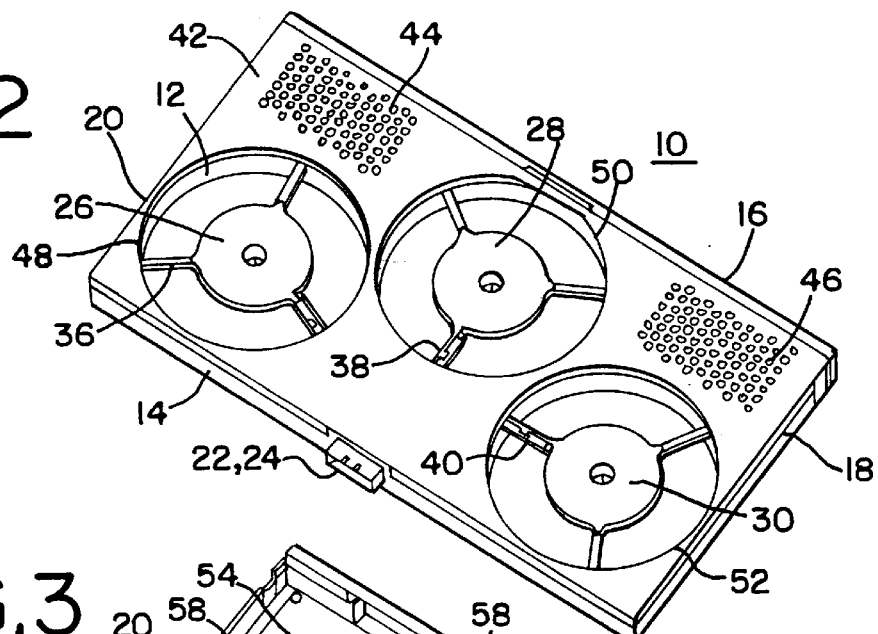
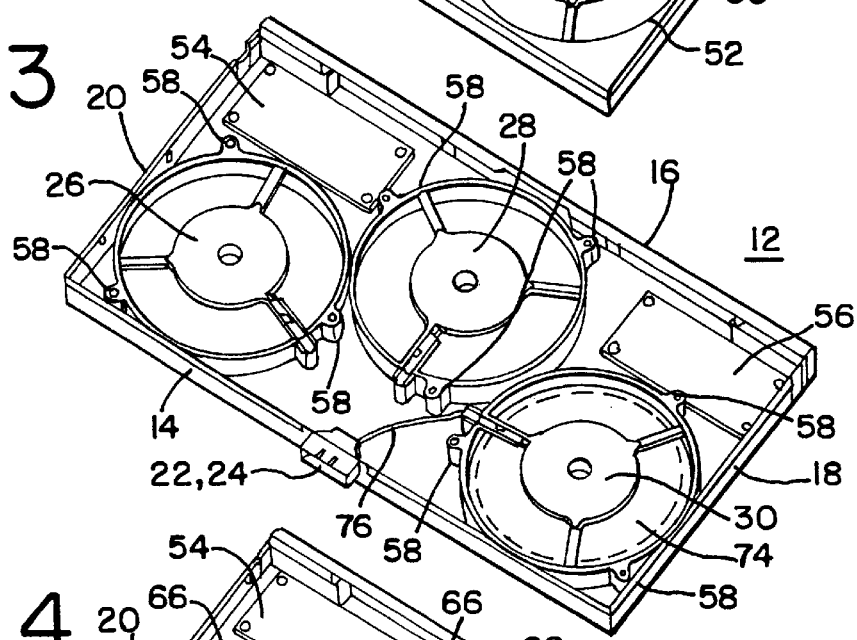
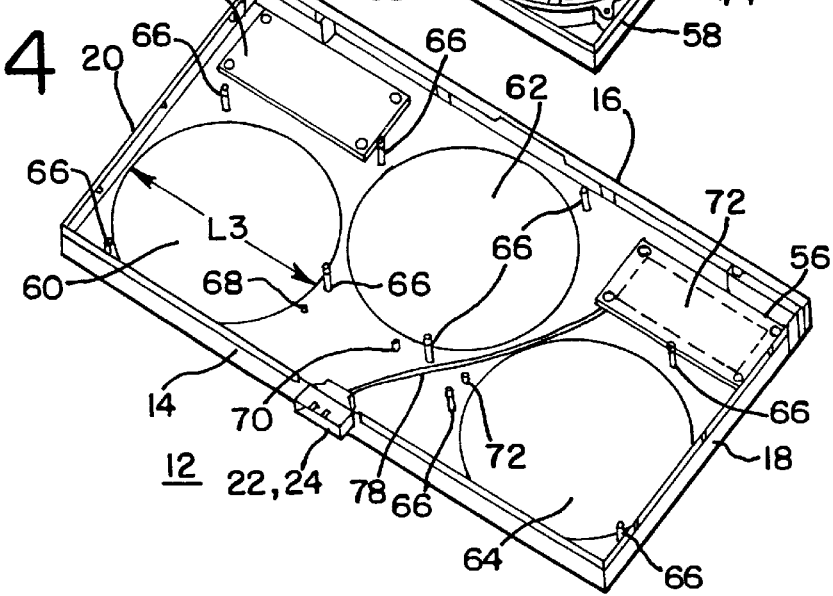

APPARATUS FOR HOUSING FANS

FIELD OF THE INVENTION

The present invention relates to an apparatus for housing fans, and in particular, to an apparatus for housing fans and multiple DC/DC converters, for use in cooling electronic devices.

BACKGROUND OF THE INVENTION

Among other uses, fans are presently utilized to reduce the temperature of the various parts of electronic equipment. Typically, these fans are housed within fan housings, which are then placed within an apparatus, which is attached to a side of the equipment for which the fans are meant to cool. Such fan housings have been designed in many ways, encompassing differing shapes and sizes. However, in many respects, the lack of efficiency of these varying designs is readily apparent.

First, in an effort to increase the output of cooling ability of the fans, which is necessary to prevent overheating and possible meltdown of electronic devices, most designs have relied on a "bigger is better" premise, and have increased the size of the fans themselves. However, such a constructive theory has conversely led to other liabilities, including an increase in the required space, the required number of parts, the intensity of labor, the weight, and the cost of production.

As a result, such an increase in size lowered the efficiency of the temperature reduction process, as the amount of cubic feet per minute (CPM) which could be cooled became abated. Also, such a size increase runs contrary to today's electronic world, in which the aforementioned premise applies to ability, speed and power, and not to size. In fact, with the advent of laptop computers, cellular telephones, and the like, most electronic items these days emphasize their reduction in size from items past. In addition, such electronic cooling devices should include a means by which the circuitry used to power such devices can be relied upon almost indefinitely.

Finally, typical cooling devices have the added problem of being assembled in a myriad of ways, thus further increasing the efficiency of the labor involved. Also, a non-uniform method of assembly requires additional parts, such as, for example, longer electric power cables.

Accordingly, it would be desirable to provide an apparatus for housing fans that could maintain proper redundancy and a high CPM, while keeping cost and size down, and which can be oriented in a simple manner.

SUMMARY OF THE INVENTION

An aspect of the invention provides an apparatus for housing fans. The apparatus includes a mounting body portion and first, second and third fan housings. The mounting body portion has a length, and includes first and second longitudinal sides. The first longitudinal side preferably includes a connector opening. The second longitudinal side may also receive first and second latches. The mounting body portion may also include first and second lateral sides. The connector opening preferably receives a connector. The mounting body portion may also include first and second mounting plates for receiving DC/DC convertors. Each of the DC/DC convertors may include a cable, which may be coupled to the connector. The mounting body portion may also include first, second and third openings, each opening having a length. Preferably, the mounting body portion may also include first, second and third guide portions extending in an upward direction. The fan housings are operably attached to the mounting body portion. The fan housings also have a length. The sum of the lengths of the fan housings is greater than the length of the mounting body portion. Preferably, the fan housings are circular in shape, thus making the lengths a diameter. Also, each fan housing preferably includes a plurality of fastener flanges spaced along a perimeter region of the fan housings, each flange having an opening for receiving a fastener. The fasteners are preferably used to operably attach the fan housings to the mounting body portion. The fan housings include a cable trough. Each of the cable troughs is oriented adjacent to a region of the mounting body portion bounded by each of the fan housings, and, preferably, the first longitudinal side. Each fan housing also preferably includes a guide flange for receiving a guide portion. Preferably, the fan housings receive fans. Each of the fans may include a cable, which may be positioned within the cable troughs and coupled to the connector. The apparatus may also include a top portion operably attached to the lateral and longitudinal sides of the mounting body portion. The top portion may also include first, second and third openings and first and second sets of air vent openings. Both the fans and the DC/DC convertors are preferably powered by an electrical current transmitted via the connector through each of the cables of the fans and the DC/DC convertors.

The invention provides the foregoing and other features, and the advantages of the invention will become further apparent from the following detailed description of the presently preferred embodiments, read in conjunction with the accompanying drawings. The detailed description and drawings are merely illustrative of the invention and do not limit the scope of the invention, which is defined by the appended claims and the equivalents thereof.

BRIEF DESCRIPTION OF THE DRAWINGS

FIG. 1a is a front view of a preferred embodiment of an apparatus for housing fans and multiple DC/DC convertors, made in accordance with the invention;

FIG. 1b is a top view of the embodiment of FIG. 1a;

FIG. 1c is a bottom view of the embodiment of FIG. 1a;

FIG. 1d is a side view of the embodiment of FIG. 1a;

FIG. 2 is a front perspective view of the embodiment of FIG. 1a;

FIG. 3 is a front perspective view of the embodiment of FIG. 1a, shown without the top portion;

FIG. 4 is a front perspective view of the embodiment of FIG. 1a, shown without the top portion and the first, second and third fan housings;

FIG. 5b is a front view of the embodiment of FIG. 5a.

DETAILED DESCRIPTION OF THE PRESENTLY PREFERRED EMBODIMENTS

Figure 5A:
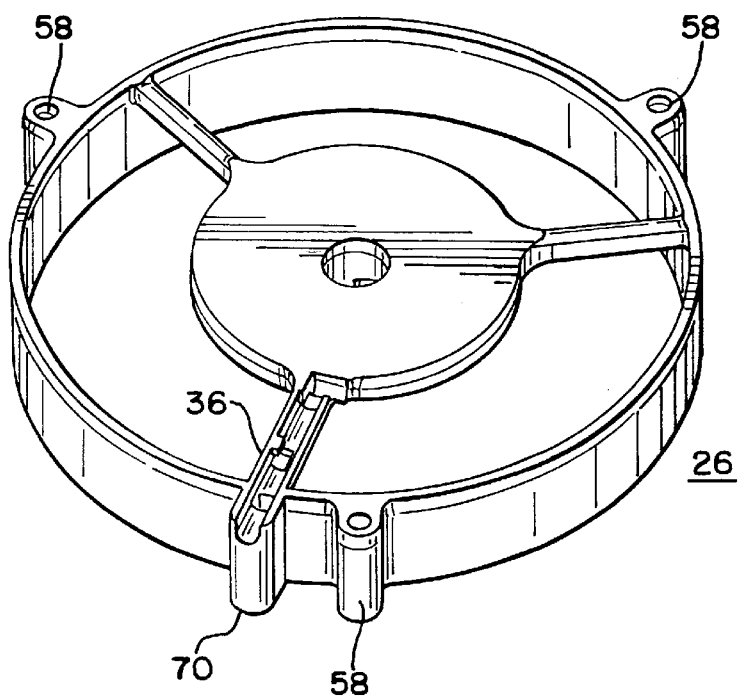
FIG. 5a is a front perspective view of a preferred embodiment of a fan housing, made in accordance with the invention.

Referring to FIGS. 1a, 1c and 3, reference numeral 10 represents a preferred embodiment of an apparatus for housing fans. The apparatus 10 comprises a mounting body portion 12 and first, second and third fan housings 26, 28, 30. The mounting body portion 12 has a length L1, and includes first and second longitudinal sides 14, 16. The fan housings 26, 28, 30 are operably attached to the mounting body portion 12. The fan housings 26, 28, 30 have a length L2. The sum of the lengths L2 of each of the fan housings 26, 28, 30 are greater than the length L1 of the mounting body portion 12. Each of the fan housings 26, 28, 30 include cable troughs 36, 38, 40. Each of the cable troughs 36, 38, 40 are oriented adjacent to a region 13 of the mounting body portion 12 which is bounded by each of the fan housings 26, 28, 30. In the preferred embodiment, the first longitudinal side 14 also bounds the region.

The apparatus 10 can be made out of any rigid material, but will preferably be made out of a metallic material, such as, for example, sheet metal, aluminum, stainless steel, etc. The mounting body portion 12 provides the base of the apparatus 10. The two longitudinal sides 14, 16 are preferably disposed on opposing parallel ends of the mounting body portion 12. Preferably, the mounting body portion 12 also comprises a first lateral side 18 and a second lateral side 20. Preferably, the two lateral sides 18, 20 are disposed on opposing parallel ends of the mounting body portion 12 perpendicular to the two longitudinal sides 14, 16.

The first longitudinal side 14 is shown in more detail in FIG. 1c, and includes a connector opening 22, which is adapted for receiving a connector 24. The connector 24 is preferably a standard female electronic connector, which may be connected with an appropriate standard male connector for use in providing an electric current to the apparatus 10. The second longitudinal side 16 is shown in more detail in FIG. 1b, and includes two latches 32, 34. The latches 32, 34, which are preferably spring-loaded, are inserted into openings (not shown) in the second longitudinal side 16 and are used to bias the apparatus 10 into position within an electronic, or other, device of which the apparatus 10 is meant to reduce the temperature.

Referring to FIG. 3, first and second mounting plates 54, 56 are shown. The mounting plates 54, 56 are used to preferably receive DC/DC convertors, or any similar device used to power the apparatus 10 and maintain redundancy, which are shown in phantom at reference numeral 72. Preferably, the DC/DC convertors 72 are standard convertors presently used in the field, and preferably include cables, the path of which is also shown in phantom at reference numeral 78.

FIG. 3 also shows more detail with regards to the fan housings 26, 28, 30. Specifically, the fan housings 26, 28, 30 are shown with a plurality of fastener flanges 58, which are spaced along a perimeter region of the fan housings 26, 28, 30. As shown, the fastener flanges 58 include an opening. This allows the fasteners 66 entry into the fastener flanges 58, and secures the fan housing 26 to the mounting body portion 12.

FIG. 4 shows the inside of the mounting body portion 12 of the apparatus 10. Disposed within the mounting body portion 12 are first, second and third openings 60, 62, 64. The openings 60, 62, 64 are approximately equal in length L3 with respect to each other. The openings 60, 62, 64 of the mounting body portion 12 are used in a way similar to that of the openings 48, 50, 52 of the top portion 42, that being to allow air to enter the apparatus 10 in an effort to reduce the temperature of the electronic device. Also shown in FIG. 4 are the guide portions 68, 70, 72. Each of the guide portions 68, 70, 72 are preferably disposed along the perimeter region of one of the openings 60, 62, 64 of the mounting body portion 12. The purpose of the guide portions 68, 70, 72 is to preferably orient the fan housings 26, 28, 30 as they are attached to the mounting body portion 12, and allow assembly of the apparatus 10 in a relatively simple manner.

Shown on each of the fan housings 26, 28, 30 are cable troughs 36, 38, 40. The fan housings 26, 28, 30 preferably receive fans, which are shown in phantom at reference numeral 74. The fans 74 are used for reducing the temperature of the specific electronic, or other, device. The fans 74 are electrically powered through a cable, the path of which is shown in phantom at reference numeral 76. The cables 76 are positioned within the cable troughs 36, 38, 40, and are connected to a connector 24. The connector 24 is then positioned within the connector opening 22. The cables 76, 78 of both the DC/DC convertors 72 and the fans 74 are coupled to the connector 24. An electric current used to power the fans 74 is preferably transmitted through the connector 24, the cables 76 and ultimately to the fans 74 themselves. Similarly, an electric current used to power the DC/DC convertors 72 is preferably transmitted through the connector 24, the cables 78 and ultimately to the DC/DC convertors 72 themselves.

Figure 5B:
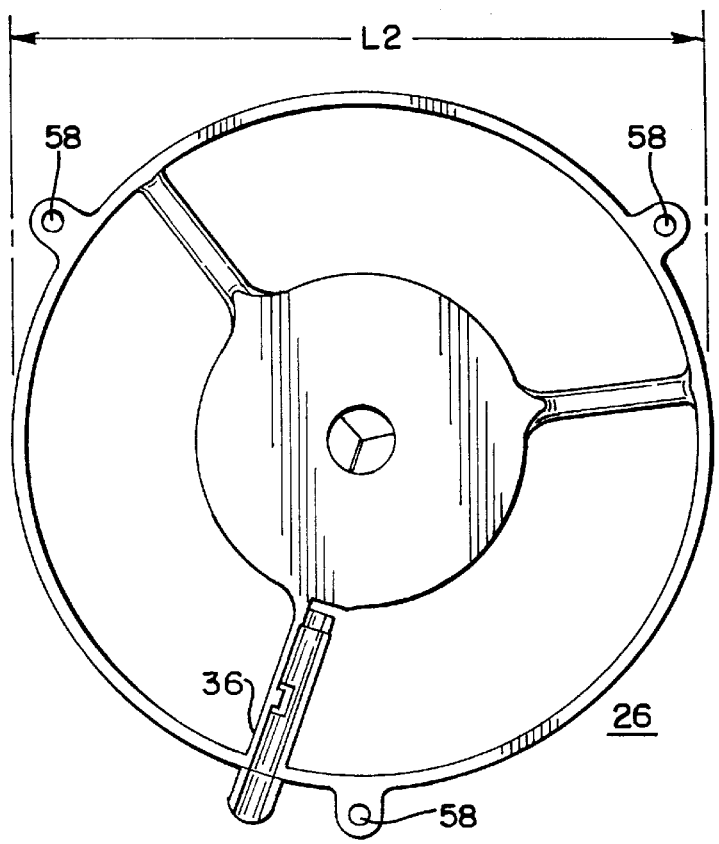

Referring to FIGS. 5a–b, a more detailed view of the first fan housing 26 is shown. Preferably, for purposes of the preferred embodiment, the first fan housing 26 is substantially similar to the second and third fan housings 28, 30. Additionally, the fan housing 26 is preferably circular in shape, but any shape which will fit within the apparatus 10 will suffice. Also, the length L2 of the fan housing 26 may preferably, when circular housings 26, 28, 30 are used, be a diameter. The lengths L2 of each of the fan housings 26, 28, 30 may preferably be approximately equal with respect to each other. The first fan housing 26 is shown with the cable trough 36, and the plurality of fastener flanges 58. Also shown on the fan housing 26 is the guide flange 70. The guide flange 70 is preferably disposed on the cable trough 36, and projects in a downward direction. The guide flange 70 is preferably disposed adjacent to the cable trough 36 of the fan housing 26 and to one of the fastener flanges 58. The guide flange 70 is used to orient the fan housing 26 into the mounting body portion 12, by permitting placement of the fan housing 26 on the guide portion 68 of the mounting body portion 12 only through the guide flange 70. In other words, the guide portion 68 is received in the guide flange 70. Thus, there is only one orientating way for the fan housing 26 to be attached to the mounting body portion 12.

Finally, shown in FIG. 1a is the top portion 42 of the apparatus 10. The top portion 42 is operably attached, preferably through the use of screws 80 as shown, to the first longitudinal side 14, the first lateral side 18 and the second lateral side 20 of the apparatus 10. The top portion 42 is also operably attached to the second longitudinal side 16, preferably by sliding underneath the lip of the second longitudinal side 16. Preferably disposed on the top portion 42 are first and second sets of air vent openings 44, 46. These sets of air vent openings 44, 46 are used to provide and maintain an air flow within the apparatus 10. Also disposed on the top portion 42 are first, second and third openings 48, 50, 52, which also allow an air flow to enter the fan housings 26, 28, 30. The openings 48, 50, 52, which are approximately equal in length L4 with respect to each other, are preferably disposed over the fans 74, and correspond in location, and size, to the openings 60, 62, 64 of the mounting body portion 12. Additionally, the sets of air vent openings 44, 46 are preferably disposed within a region of the top portion 42 which is bounded by the second longitudinal side 16 and two of the openings 48, 50, 52. Providing such an air flow preferably serves to reduce the temperature of the devices to which the apparatus 10 is directed.

Because of the placement of the guide portions 68 and the guide flanges 70, the apparatus 10 can be assembled in only one way, thus reducing labor inefficiencies and providing a simple method of assembly. First, the fans 74 are installed within the fan housings 26, 28, 30. Second, the cables 76 of the fans 74 are positioned within the cable troughs 36, 38, 40 of the fan housings 26, 28, 30. The fan housings 26, 28, 30 are then disposed over the openings 60, 62, 64 of the mounting body portion 12, such that each of the guide portions 68 is received within the guide flanges 70. The fan housings 26, 28, 30 are then operably attached to the mounting body portion 12 through the insertion of the fasteners 66 into the fastener flanges 58. The cables 76 of the fans 74 are then routed to the connector 24. In a similar manner, the DC/DC convertors 72 are positioned on the mounting plates 54, 56 of the mounting body portion 12, and the cables 78 of the DC/DC convertors 72 are also routed to the connector 24. Once assembly has been completed, an electrical current is transmitted through the connector 24 to the cables 76, 78 of the fans 74 and the DC/DC convertors 72, to power the apparatus 10.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

We claim:

1. An apparatus for housing fans, comprising:

a mounting body portion having a length and including first and second longitudinal sides; and first, second and third fan housings operably attached to the mounting body portion, each of the first, second and third fan housings having a length, the sum of the lengths of each of the first, second and third fan housings being greater than the length of the mounting body portion, each of the first, second and third fan housings including a cable trough, each of the cable troughs oriented adjacent to a region of the mounting body portion bounded by each of the first, second and third fan housings.

2. The apparatus of claim 1, wherein the region of the mounting body portion is further bounded by the first longitudinal side.

3. The apparatus of claim 2, wherein each of the first, second and third fan housings are circular in shape, each of the lengths of the first, second and third fan housings constituting a diameter.

4. The apparatus of claim 3, wherein the first longitudinal side further includes a connector opening for receiving a connector.

5. The apparatus of claim 4, wherein the mounting body portion further includes first and second mounting plates operably attached to the mounting body portion.

6. The apparatus of claim 5, wherein each of the first, second and third fan housings receives a fan, each of the fans including a cable, each of the cables being positioned within one of the cable troughs of the first, second and third fan housings and being coupled to the connector.

7. The apparatus of claim 6, wherein each of the first and second mounting plates receives a DC/DC convertor, each of the DC/DC convertors including a cable, each of the cables being coupled to the connector.

8. The apparatus of claim 7, wherein each of the first, second and third fan housings further include a plurality of fastener flanges, each of the plurality of fastener flanges having an opening for receiving a fastener and being spaced along a perimeter region of each of the first, second and third fan housings.

9. The apparatus of claim 8, wherein the mounting body portion further includes first, second and third openings having a length.

10. The apparatus of claim 9, wherein the mounting body portion further includes first and second lateral sides.

11. The apparatus of claim 10, further including a top portion, operably attached to the first and second lateral sides of the mounting body portion and the first and second longitudinal sides of the mounting body portion.

12. The apparatus of claim 11, wherein the top portion further includes first, second and third openings.

13. The apparatus of claim 12, wherein the top portion further includes first and second sets of air vent openings.

14. The apparatus of claim 13, wherein the mounting body portion further includes first, second and third guide portions extending in an upward direction from the mounting body portion.

15. The apparatus of claim 14, wherein each of the first, second and third fan housings further include a guide flange including an opening and extending in a downward direction.

16. The apparatus of claim 15, wherein each of the first, second and third fan housings are disposed over one of the first, second and third openings of the mounting body portion, to allow each of the guide portions of the mounting body portion to be received within the guide flanges of the first, second and third fan housings.

17. The apparatus of claim 16, wherein each of the first, second and third fan housings are operably attached to the mounting body portion by inserting the fasteners into each of the fastener flanges.

18. The apparatus of claim 17, wherein each of the lengths of the first, second and third fan housings are approximately equal with respect to each other, each of the lengths of the first, second and third openings of the mounting body portion are approximately equal with respect to each other, and each of the lengths of the first, second and third openings of the top portion are approximately equal with respect to each other.

19. The apparatus of claim 18, wherein the second longitudinal side receives first and second latches.

20. The apparatus of claim 19, wherein each of the fans and each of the DC/DC convertors are powered by an electrical current transmitted via the connector through each of the cables of the fans and the DC/DC convertors.

* * * * *

UNITED STATES PATENT AND TRADEMARK OFFICE
CERTIFICATE OF CORRECTION

PATENT NO. : 5,997,266
DATED : December 7, 1999
INVENTOR(S) : Daniel J. Lecinski, et al.

It is certified that error appears in the above-identified patent and that said Letters Patent is hereby corrected as shown below:

On the title page, item [54] and column 1:
  Change the title from "Apparatus For Housing Fans"
to --An Apparatus For Housing Fans Having A Compact Fan Arrangement--.

Signed and Sealed this

Eighth Day of August, 2000

Attest:

Q. TODD DICKINSON

*Attesting Officer*

*Director of Patents and Trademarks*